United States Patent [19]

Knüttel

[11] Patent Number: 5,361,054

[45] Date of Patent: Nov. 1, 1994

[54] MAGNET SYSTEM

[75] Inventor: Bertold Knüttel, Rheinstetten, Germany

[73] Assignee: Bruker Analytische Messtechnik GmbH, Germany

[21] Appl. No.: 37,717

[22] Filed: Mar. 24, 1993

Related U.S. Application Data

[63] Continuation of Ser. No. 675,454, Mar. 26, 1991, abandoned.

[30] Foreign Application Priority Data

Mar. 29, 1990 [DE] Germany ............................. 4010032

[51] Int. Cl.$^5$ ........................... H01F 7/22; G01V 3/00
[52] U.S. Cl. ..................................... 335/216; 324/318
[58] Field of Search ..................... 335/216, 296-301, 335/304; 324/318-320; 128/653 SC, 653 R, 653 A; 505/892, 893

[56] References Cited

U.S. PATENT DOCUMENTS

| | | | |
|---|---|---|---|
| 4,646,046 | 2/1987 | Vavrek et al. | 335/301 |
| 4,721,914 | 1/1988 | Fukushima . | |
| 4,766,378 | 8/1988 | Danby | 324/319 |
| 4,875,485 | 10/1989 | Matsutani | 128/653 |
| 4,902,995 | 2/1990 | Vermilyea | 335/216 |
| 4,984,574 | 1/1991 | Goldberg et al. | 128/653 A |
| 4,985,678 | 1/1991 | Gangarosa et al. | 324/318 |
| 5,061,897 | 10/1991 | Danby et al. | 324/318 |
| 5,117,188 | 5/1992 | Ohkawa | 324/318 |
| 5,124,651 | 6/1992 | Danby et al. | 324/318 |
| 5,138,326 | 8/1992 | Edwards et al. | 324/319 |
| 5,207,224 | 5/1993 | Dickinson et al. | 128/653.5 |

FOREIGN PATENT DOCUMENTS

| | | | |
|---|---|---|---|
| 0067933 | 4/1982 | European Pat. Off. | G01N 24/06 |
| 0160350 | 1/1985 | European Pat. Off. | G01N 24/06 |
| 0350267 | 10/1990 | European Pat. Off. . | |
| 3308157 | 3/1983 | Germany | H01F 7/22 |
| 3616078 | 5/1986 | Germany | G01N 24/06 |
| 63-289473 | 5/1988 | Japan | G01N 24/06 |
| 2115522 | 9/1989 | United Kingdom . | |

OTHER PUBLICATIONS

Maris et al., "New Approach to Lim Exercise–Short Magnet" Society of Magnetic Resonance of Medcine, Book of Abstracts, vol. 2, Eighth Annual Meeting, Aug. 12–18, 1989, p. 539.

*Primary Examiner*—Leo P. Picard
*Assistant Examiner*—Ramon M. Barrera
*Attorney, Agent, or Firm*—Walter A. Hackler

[57] ABSTRACT

A magnet system for nuclear spin resonance spectroscopy, in particular for in-vivo spectroscopy and tomography on a limb or a shoulder of a human body (partial-body tomography) comprising a superconductive magnet coil arrangement having coil sets (2a, 3a; 2b, 3b) arranged at an axial spacing one from the other, for generating a static homogeneous magnetic field in an examination volume, and further a coil frame (6) carrying the coil sets and a cryostat intended for cooling the windings, is characterized by the fact that the windings are rigidly interconnected by the coil frame at low temperature and that there is provided a transverse room-temperature access (50) to the examination volume which extends over approximately 180° in circumferential direction, related to the axis (4) of the magnet coil arrangement. This enables examinations to be carried out at ease.

15 Claims, 5 Drawing Sheets

MAGNET SYSTEM

This is a continuation of copending application Ser. No. 07/675,454 filed on Mar. 26, 1991, now abandoned.

BACKGROUND OF THE INVENTION

The present invention relates to a magnet system for nuclear spin resonance spectroscopy, in particular for in-vivo spectroscopy and tomography on a limb or a shoulder of a human body (partial-body tomography) comprising a superconductive magnet coil arrangement having coil sets arranged at an axial spacing one from the other, for generating a static homogeneous magnetic field in an examination volume, and further a coil frame carrying the coil sets and a cryostat intended for cooling the windings.

Superconductive magnet systems for partial-body tomography that have been manufactured heretofore have a geometry similar to magnet systems used for whole-body tomography, except that their dimensions are smaller. The measuring possibilities of such systems are severely limited by the relatively big distance between the field center and the outer flange. Compare for example the Bruker Biospec Systems. If such a conventional magnet system, which displays a substantially circular cylindrical shape and a room-temperature bore, is to be used, for example, for examining a patient's leg, the patient must bend his other leg or spread it off so as if he were to do the splits—an attitude which is rather uncomfortable or even impossible. There have been certain attempts at reducing the length of the systems, or at generating adequately homogeneous field areas outside the magnet structure proper (e.g. Michael Marls et al. in "New Approach to Limb Exercise-Short Magnet" in Society of Magnetic Resonance in Medicine, Book of Abstracts, Vol. 2, Eighth Annual Meeting Aug. 12-18, 1989, page 539; U.S. Pat. No. 4,721,914; EP-A-0 160 350).

SUMMARY OF THE INVENTION

Now, it is the object of the present invention to provide a magnet system of the type described above which facilitates the examination procedure for the patient.

The invention achieves this object by the fact that the windings are rigidly interconnected by the coil frame at low temperature and that there is provided a transverse room-temperature access to the examination volume which extends not more than approximately 180° in circumferential direction, related to the axis of the magnet coil arrangement.

The invention is suited for application also in volume-selective spectroscopy with or without imaging processes. It is one of the advantages of the invention that a room-temperature access is provided for movements in a direction perpendicular to the longitudinal axis of the magnetic field, which enables, for example, a leg or an arm to be introduced into the area between two coil sets and, thus, into the homogeneous area of the examination volume, in stretched condition. This can be effected with ease in particular when—as is the case in certain preferred embodiments of the invention—the transverse room-temperature access extends over an angle of approximately 240° (with a minus deviation of maximally 30°). Compared with an angle of 180°, for example, this then enables a greater portion of the area of homogeneity, which lies symmetrically to the axis of the magnet system, to be utilized for examination of a stretched leg, for example. The invention also makes it possible to have the leg, for example, loaded during examination by suitable mechanical straining devices, and to measure thereafter by in-vivo spectroscopy the phosphorous consumption as a function of strain.

Preferably, the whole area of homogeneity, which normally has a substantially spherical geometry, is accessible for examination purposes, regardless of the size of the angle covered by the transverse room-temperature access. It may be necessary for this purpose to provide an additional recessed area in the wall delimiting the room-temperature access so as to give access to the complete area of homogeneity, or to give the central portion of the coil frame the cross-sectional shape of a segment of a hollow cylinder, or else to give the said central portion the cross-sectional shape of a segment of solid cylinder, in which latter case the distance of the level peripheral surface from the axis of the magnet system must be at least equal to the radius of the area of homogeneity. According to one embodiment of the invention, these design criteria result in an arrangement where the room-temperature access covers an angle of approximately 240° relative to the axis of the magnet system.

The relatively large transverse room-temperature access influences the shape of the coil frame; but it must be ensured that it does not impair the absolutely rigid mounting of the coil sets. The coil frame, therefore, must be designed in such a way as to guarantee the rigid mounting of the coil sets, which must also be capable of absorbing the considerable magnetic forces, the coil frame being at a temperature below the superconduction transition temperature of the coils. Given the fact that the coil frame hardly can be prevented from getting distorted during running-up (charging) of the magnet system, this distortion has to be taken into account in determining the design criteria of the magnet system.

According to certain embodiments of the invention, the cross-section of the coil frame in the area between the coil sets may substantially have the shape of a segment of a hollow cylinder. According to other embodiments of the invention, the same area of the coil frame may be formed by rods extending in the axial direction.

When the room-temperature access extends over an angle of approx. 180° or more, as is the case with certain preferred embodiments of the invention, then the coil frame generally is not rotationally symmetrical relative to the axis of the magnet system; rather, it is at best mirror-symmetrical relative to the center plane in the direction perpendicular to the axis of the magnet system.

According to one embodiment of the invention, the cryostat comprises a first coolant tank for a first coolant, helium in the present example, and the first coolant tank is located in part in the area of that part of the coil frame which interconnects the winding arrangements. While there is almost any desired amount of space available especially on the outer side of the before-mentioned part of the coil frame, the cryostats should not take up too much room on the inner side of the before-mentioned area of the coil frame and the sides of the coil-arrangement facing each other, so as not to reduce the examination volume.

According to one embodiment of the invention, another coolant tank is provided for an additional coolant, nitrogen in the present example, having a temperature higher than the first coolant, this tank being arranged in the area of the outside (relative to the radial direction) of the part of the coil frame which interconnects the winding arrangements, and outside of the first coolant tank, acting as a thermal screen for the latter. Other embodiments of the invention make use at this point of the heat exchanger of a refrigerator. As has been mentioned before, there is ample space available at this point for installations of this kind.

According to one embodiment of the invention, radiation screens are provided which are thermally connected to the first coolant and which surround the winding arrangements at a small spacing. The space inside the said radiation screens may be filled with the first coolant and/or its vapor. However, this is not necessarily so, it being also possible to restrict the first coolant to the area of the outside of the central portion of the coil frame.

Cooling of the winding arrangements down to their superconductive state can be assured in this case by giving the coil frame a suitable design, in particular by making it in the conventional manner from a thermally conductive material, in particular from aluminium.

According to certain embodiments of the invention, additional radiation screens are provided which are thermally connected to the second coolant and/or the refrigerator and which surround the winding arrangements at a small spacing. A particularly advantageous arrangement is obtained when the second coolant, if any, or its vapor do not enclose both winding arrangements completely, as in this case a tight jacket would have to be provided in the area of the winding arrangements which would require more space than is needed for radiation screens which are thermally connected to the additional coolant tank arranged in the area of the outside of the central portion of the coil frame. The axis of the magnet extends, preferably, in horizontal direction. However, other embodiments of the invention are imaginable where the axis of the magnet extends vertically. In this case, the cryostat must be adapted correspondingly. The coolant tanks may then be arranged in particular in the lower area, or laterally beside the coil frame (in the area of its central portion).

According to one embodiment of the invention, ferromagnetic plates (this term includes for the present purposes ferromagnetic annular discs) are arranged outside the cryostat, in the proximity of the outer sides, viewed in the axial direction, of the winding arrangements, which ferromagnetic plates are rigidly connected one to the other. Without these ferromagnetic plates, the currents flowing in the winding arrangements tend to move the winding arrangements toward each other. Given the fact that the coil frame extends over a small circumferential angle only, this may lead to difficulties as regards the sufficiently strong design of the coil frame. When the before-mentioned ferromagnetic plates are provided, the currents flowing in the winding arrangements, in combination with the ferromagnetic plates, result in additional forces which tend to move the winding arrangements in the direction of the respective neighboring ferromagnetic plate so that the first-mentioned forces are compensated in part. If the ferromagnetic plates are additionally interconnected by a ferromagnetic yoke, this has the result to intensify the magnetic field. determining the design criteria for the winding arrangements and the whole magnetic system, the presence of the plates and of the yoke must be taken into account. The ferromagnetic plates and their interconnecting structure conveniently should not be supported by the remaining magnet system so that the latter does not have to absorb any external forces. The ferromagnetic plates may be part of the outer wall of the cryostat. The ferromagnetic plates also act as a magnetic and electric screen. In addition, or alternatively, active magnetic screening arrangements may be provided in the form of superconductive coils which are passed by oppositely directed currents in the manner known as such.

A particularly advantageous arrangement is achieved when the following dimensions are selected: The clear axial distance between the radially outer windings is 40% to 60% of the inner diameter of the radially outer windings. The clear axial distance between the radially inner windings is equal to the clear axial distance between the radially outer windings, with a deviation of maximally 15%. The current flowing through the radially inner windings is oppositely directed to the current flowing through the radially outer windings. The magnet system forms a coil system of quasi the 8th order. In the case of a coil system of the 8th order, any derivatives of the magnetic field for the space coordinates disappear at the center, up to and including the 7th degree. A double-Helmholtz arrangement constitutes such a system of the 8th order. However, it is not absolutely necessary to use a coil system of exactly the 8th order. Rather, it is in fact possible to move the coils of a coil system a little further apart as would be required for obtaining the 8th order, whereby the shape of the volume of homogeneity is distorted relative to the spherical shape—in which case a certain residual ripple has to be taken into account—so that the resulting volume of homogeneity is one where the boundary has a deviation of 20 ppm, for example, not only in one direction (for example minus 20 ppm), but in both directions, i.e. ±20 ppm. Systems of this type, which largely fulfill the conditions of the 8th order and which, therefore, will be described herein as systems of quasi the 8th order, can also be used for the present purposes. It need not be mentioned that the invention also extends to systems of the 12th order, such a system being of course at the same time a system of the 8th order. The magnetic field of superconductive magnet systems usually has an intensity of 0.5 Tesla or more.

Other features and advantages of the invention will appear from the following description of one embodiment of the invention by reference to the drawing, which shows essential details of the invention, and from the claims. The individual features may be implemented in any embodiment of the invention each individually, or in any combination thereof.

BRIEF DESCRIPTION OF THE DRAWING

FIG. 1b is a cross section view of the embodiment shown in FIG. 1 taken along the line 1b—1b;

DESCRIPTION OF THE PREFERRED EMBODIMENT

Figure 1:
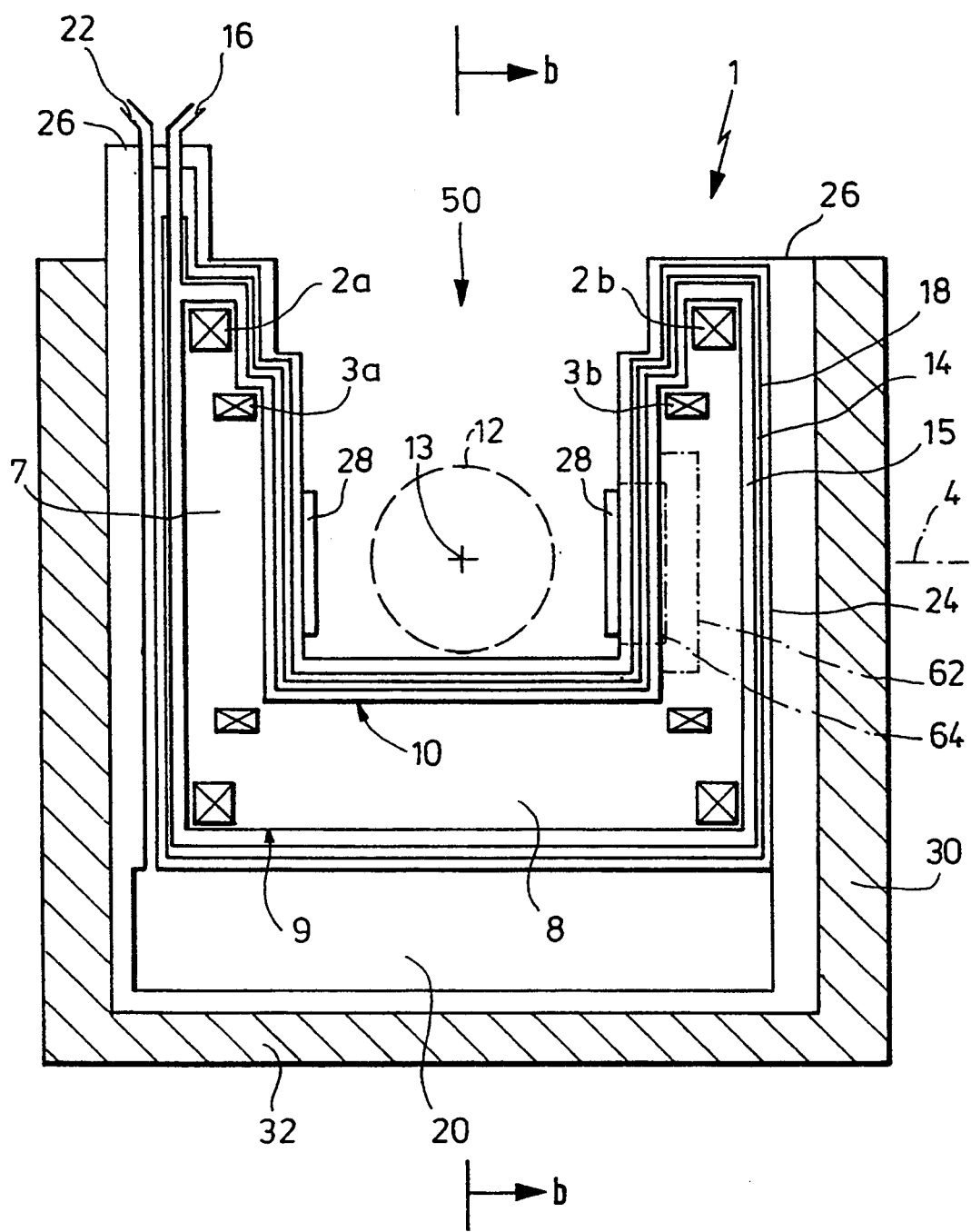
FIG. 1 shows an axial longitudinal cross-section through one embodiment of the magnet system.

In FIG. 1, the entire magnet system, including the cryostat, are indicated generally by reference numeral 1. A first coil set comprises partial coils 2a and 3a provided in coaxial arrangement. A second coil set comprises partial coils 2b and 3b, arranged at a certain distance from the first-mentioned coil set, but also in coaxial arrangement relative to the axis of the latter. The axis 4 of the before-mentioned coils and, thus, the axis of the magnet system, extends horizontally, in the drawing plane of FIG. 1. A coil frame 6 made from an aluminium alloy has the shape illustrated by the perspective view of FIG. 2; it comprises two disc-shaped parallel end portions 7 which serve to fix in place the partial coils 2a and 3a on the one hand and 2b and 3b on the other hand, and a central portion 8 which interconnects the disc-shaped end portions and whose cross-section, taken perpendicularly to the axis 4, has substantially the shape of a segment of a circular disc, being defined by the circular cylindrical outer surface 9 and a plane inner surface 10; see also FIG. 3a. Regarding the view of FIG. 1, the inner surface 10 extends exactly at the same level, both before and behind the drawing plane, as in the central longitudinal section taken through the thickest area of the central portion 8 of the coil frame.

This very sturdy portion 8 interconnects the disc-shaped end portions 8 of the coil frame 6 so rigidly that the magnetic forces acting mutually between the coils 2a to 3b are safely absorbed so that any unforeseeable change in position of the coils cannot affect the homogeneity of the magnetic field in a substantially spherical area of homogeneity 12 which extends symmetrically to the axis 4 and to a center plane perpendicular to the said axis, related to the partial coils 2a to 3b, and which has its center 13 located on the axis 4.

For the purposes of the following discussion it will be assumed—and this is in fact a preferred embodiment of the invention—that the thickest part of the central area 8 of the coil frame points in downward direction. The coil frame 6 is surrounded entirely by a tight metal jacket which forms an outer wall 14 of a first coolant tank 15 for helium. The outer wall 14 is spaced from the coil frame 6 on all sides. The helium vapor is guided off through a vapor line 16. A first radiation screen 18 spaced from the outer wall 14 of the helium tank on all sides is thermally connected to the vapor line 16 of the helium tank. In operation, the first radiation screen 18 assumes a temperature of approx. 20K. Below the central area 8 of the coil frame 6, and outside of the first radiation screen 18 located in this area, there is provided, in the case of the illustrated embodiment, a second coolant tank for nitrogen, with a vapor line 22 extending in upward direction in the left part of the arrangement. To the nitrogen tank 20 and the vapor line 22, there is connected in thermally conductive relationship a second radiation screen 24 which is spaced from the first radiation screen 18 on all sides. The second radiation screen 24 assumes a temperature of 77K in operation. The whole arrangement is enclosed by an outer wall 26 serving as mechanical protection for the system.

The U shape of the inner space of the cryostat, which can be seen best in the longitudinal cross-sectional view of FIG. 1 and which accommodates the examination volume 12, displays the same cross-section throughout, as viewed in FIG. 1, so that an arm, a leg or a shoulder of a patient can be positioned in this inner space in stretched condition, for example in a direction substantially perpendicular to the drawing plane, in such a way that the area of interest can be located in the area of homogeneity 12 of the magnet system and can be examined in this position with the aid of an imaging process or in some other way. In the illustration of FIG. 1, gradient and/or shim coil sets 28 are arranged on both sides of the area of homogeneity 12, on the flat outer wall 26 of the cryostat.

FIG. 1b shows a sectional view showing the room temperature access extending over an angle $\phi$ which is greater than 180°.

In other embodiments of the invention, the nitrogen tank 20 may be replaced by a vaporizer or the cryogenic source of a refrigerator, in which case the second radiation screen is connected to that cryogenic source. It need not be mentioned that no vapor line 22 is needed in this case.

The embodiments of the invention that have been described before, by reference to the drawing, can be realized without the iron plates and their interconnecting yoke 32, which are additionally shown in FIG. 1. In the absence of these last-mentioned parts, high forces are encountered in operation of the magnet system, which tend to move the partial coils toward each other, and these forces must be absorbed by the coil frame 6, in particular its central portion 8.

If, however, the said plates 30, which consist of a soft iron, more generally of a ferromagnetic material, and which are interconnected rigidly by the yoke 32, which latter preferably also consists of a ferromagnetic material, are provided at the outside (in the axial direction) of the coil sets and, as shown in the drawing, conveniently outside the cryostat, then magnetic forces will be encountered in operation between the coils and their respective neighboring plates 30 which forces tend to move the disk-shaped areas of the coil frame in axial direction, relative to the magnetic field, and toward the plates 30, or to move the plates 30 toward the coil frame. This partially compensates the before-mentioned forces which tend to move the two coil sets toward each other, whereby the mechanical strain to be absorbed by the coil frame is reduced. The ferromagnetic yoke 32 has the result that the magnetic flow is fed back and, thus, leads to an intensification of the magnetic field which has to be taken into account in designing the magnet system. At the same time, the magnetic field extending to the outside is screened off.

The arrangement according to FIG. 1 may be modified in such a way that recesses 62, either in the form of recessed portions or in the form of through-bores, are provided in the parts 7 of the coil frame 6 accommodating the coils 2a, 3a, 2b and 3b, on their sides facing each other. These recesses 62 enable the different walls and radiation screens of the cryostat to be shifted in this area toward these recesses 62 whereby recessed portions are produced in the oppositely arranged parts of the outer wall 26 of the cryostat, which recesses can be used for accommodating the gradient and/or shim coil sets 28 which enables the length of the room-temperature access 50, measured in the direction of the magnet system, to be somewhat increased in the area of the volume of homogeneity 12.

Figure 1A:
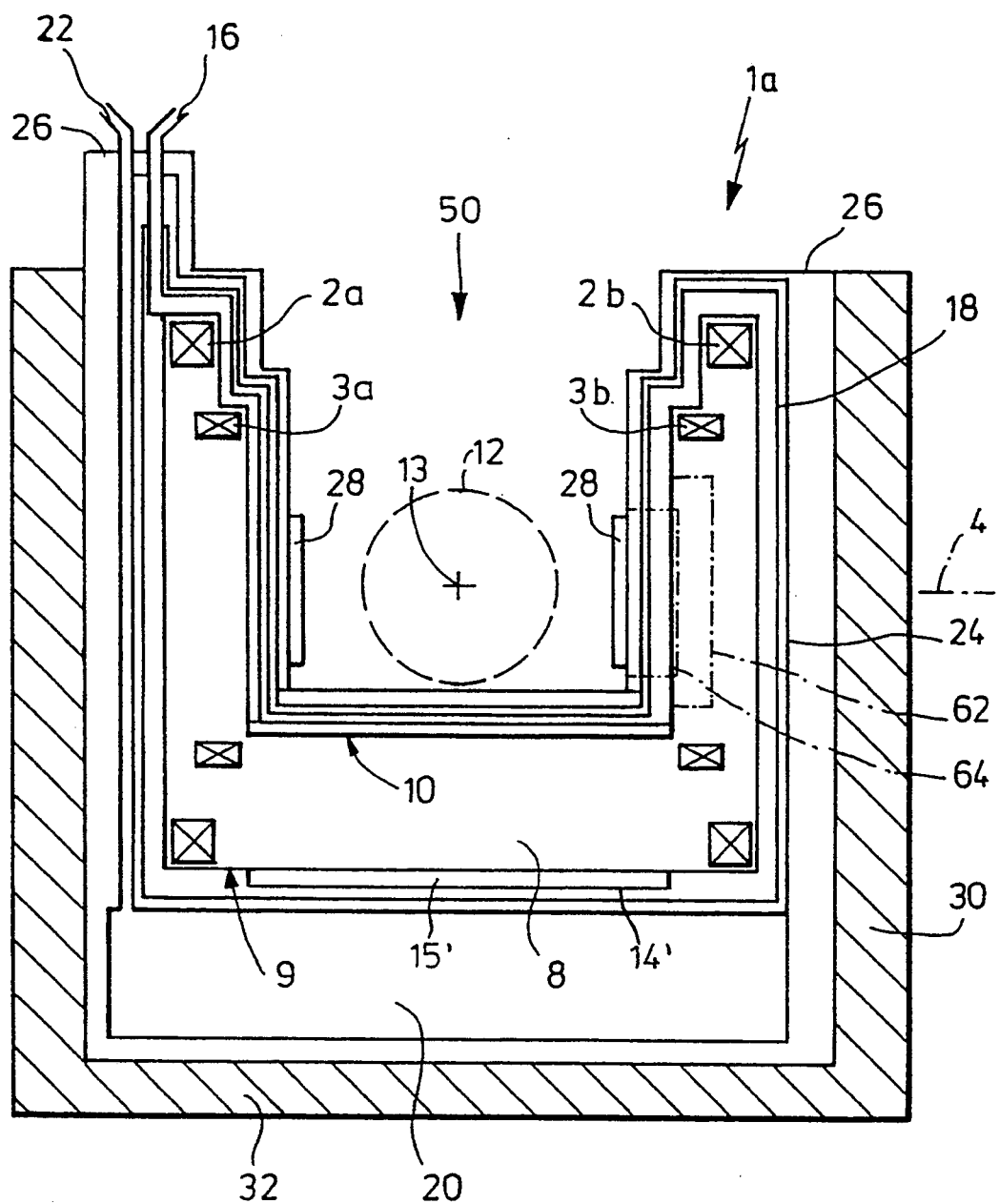
FIG. 1a is an alternative embodiment of the present invention.
Figure 1:
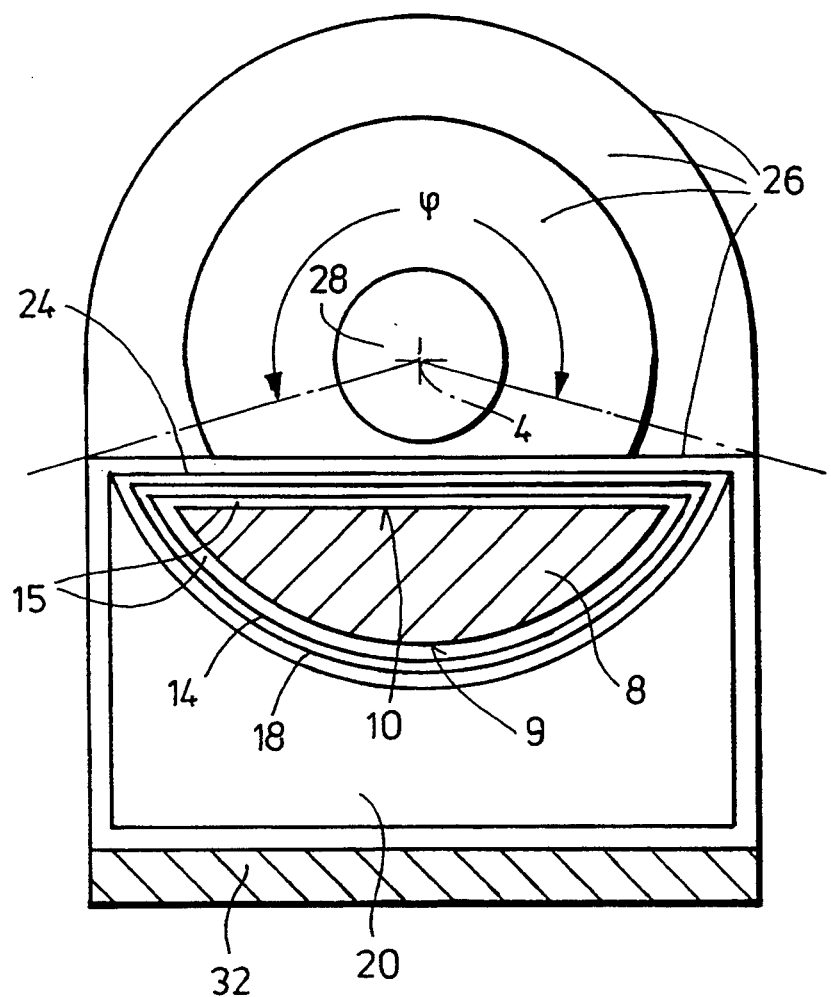

An alternative embodiment 1a of the present invention is shown in FIG. 1a. In this figure, like reference numerals or characters refer to identical or corresponding parts throughout the several views. This embodiment 1a shows a coolant tank 15' having an outer wall 14' disposed only in a region of the coil frame 8 between the coil sets 2a, 3a and 2b, 3b.

Figure 2:
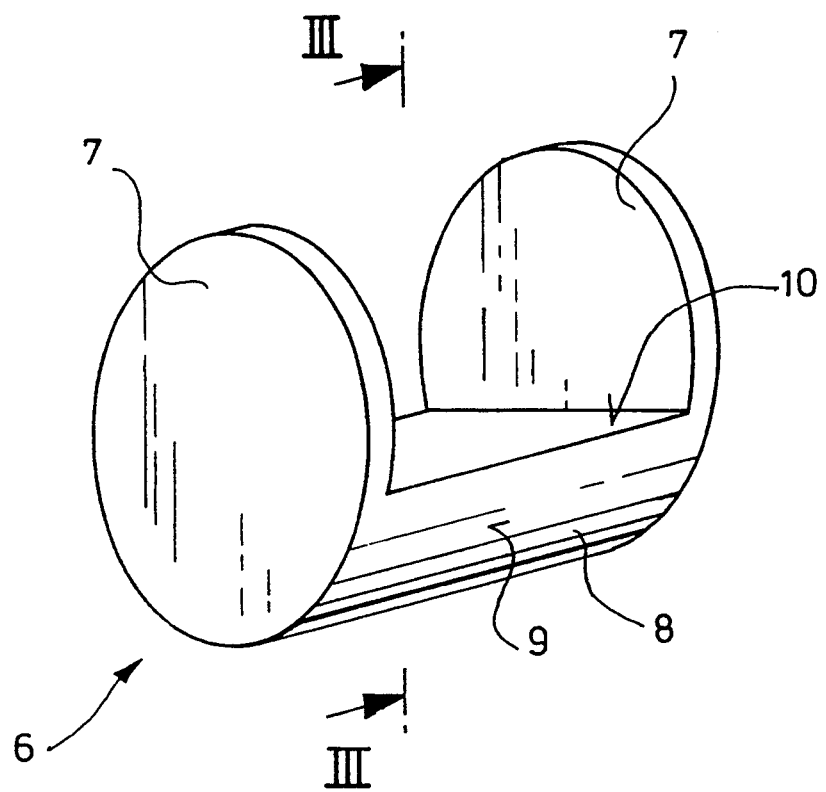
FIG. 2 shows a simplified and perspective view of the coil frame of the magnet system according to FIG. 1.
Figure 3A:
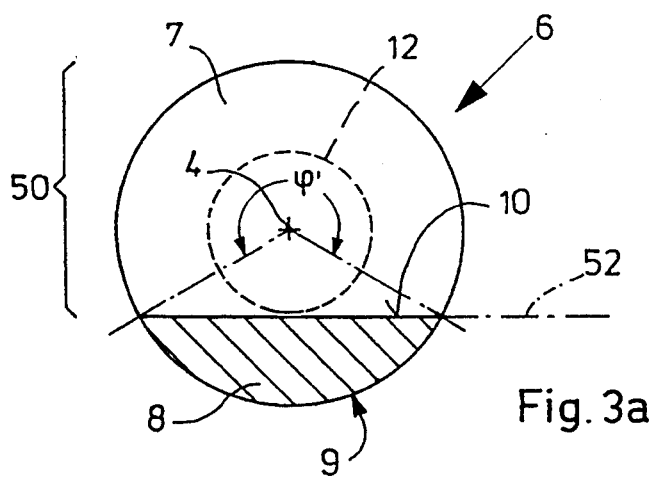
FIGS. 3a to 3d show cross-sectional views, taken along line III—III in FIG. 2, of four embodiments of the coil frame.

FIG. 3a shows a sectional view of the coil frame 6 used in the arrangement illustrated in FIGS. 1 and 2. The central portion of the coil frame 6 displays the cross-sectional shape of a segment of a solid cylinder. The room-temperature access 50 extends over an angle $\phi'$ of approx. 240°, related to the axis 4 of the magnet system. The area of homogeneity 12 is fully accessible.

Figure 3B:
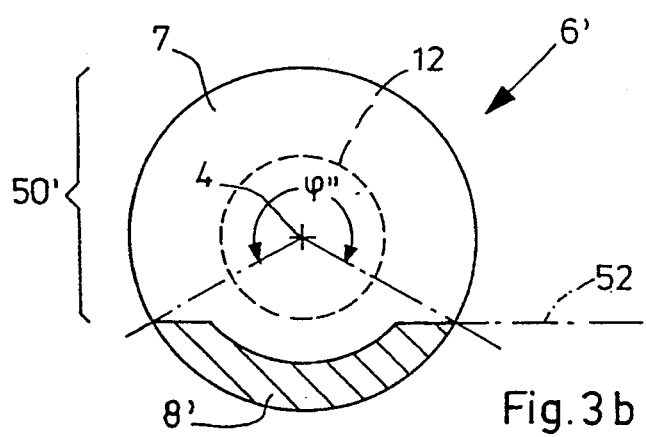

FIG. 3b shows a cross-sectional representation analogous to that of FIG. 3a, but through a different coil frame 6'. Here again, the room-temperature access 50' extends over an angle $\phi''$ of approx. 240°, related to the axis 13. The central portion 8' of the coil frame 6' displays the cross-sectional shape of a segment of a hollow cylinder. The auxiliary line 52 in FIG. 2b is located in exactly the same position as the surface 10 in FIG. 3a. The area of homogeneity 12 lies above that line 52.

Figure 3C:
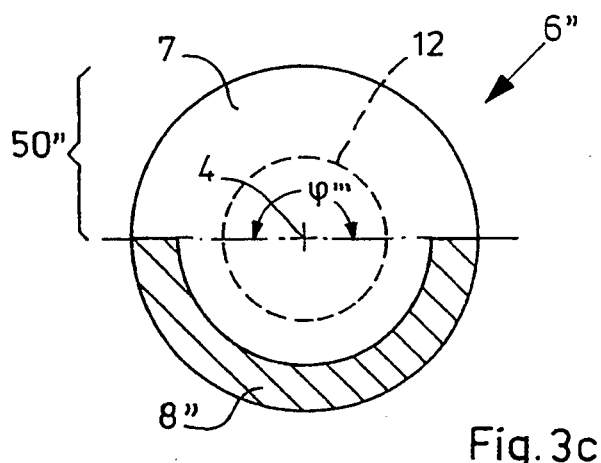

The same applies by analogy to the arrangement according to FIG. 3c, the only difference, as compared to the arrangement of FIG. 3b, being that the room-temperature access 50'' extends over an angle $\phi$ of 180° only, related to the axis 4 of the magnet system, so that only the upper half of the area of homogeneity 12 is visible from the right or from the left in FIG. 3c. In order to make the area of homogeneity 12 nevertheless accessible for examination purposes, the central portion 8'' is kept clear in a suitable manner by giving this portion 8'' again the shape of a segment of a hollow cylinder.

Figure 3D:
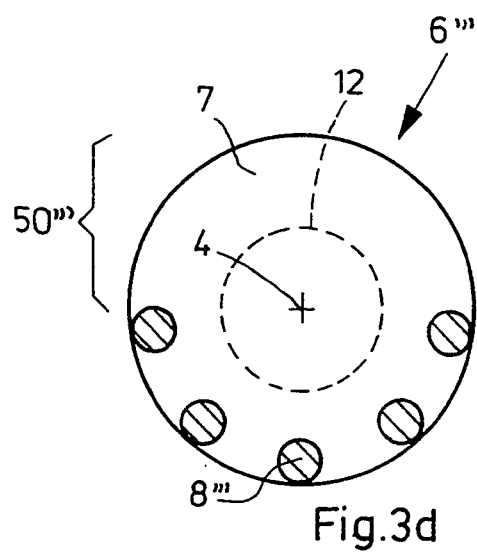

FIG. 3d shows a cross-sectional representative analogous to that of FIG. 3a, but through a different coil frame 6'''. The central portion 8''' displays the cross-sectional stage of a plurality of rods 8''' extensions in the axial direction 4. The room temperature access 50''' extends over an angle of approximately 180°.

The clear distance between the radially outer windings 2a and 2b is 395 mm. The width (in the axial direction) of each outer winding is 100 mm. The spacing between the ends of the outer windings facing away from each other measures 595 mm. The clear inner diameter of the outer winding is 806 mm. The outer diameter of the outer windings is 901 mm. The clear distance between the radially inner windings 3a and 3b is 378.8 mm. The width of each inner winding is 27.25 mm. The clear inner diameter of the inner windings is 610 mm. The outer diameter of the inner windings is 689 mm. The winding density is 36.8 conductors per $cm^2$. The current has an intensity of 157 A and generates a magnetic field of 0.7 Tesla. The area of homogeneity, with a maximum deviation of 20 ppm, is a sphere of 19 cm diameter.

The before-mentioned clear distance between the inner windings of 378.8 mm is the ideal gap of the described windings. As the cryostat itself also requires a certain amount of space, the space available in the axial direction between the before-mentioned windings is approximately equal to 300 mm.

The radially outer windings are passed by the current in equal direction, while the radially inner windings on the other hand are also passed in equal direction, but in a direction opposite to that of the outer coils.

The reference numerals appearing in the claims are not meant to restrict the invention, but only to facilitate understanding thereof.

I claim:

1. Magnet system for nuclear spin resonance spectroscopy suitable for in-vivo spectroscopy and tomography on a limb or a shoulder of a human body (partial-body tomography) comprising superconductive magnet coil means, having coil sets (2a, 3a; 2b, 3b) arranged at an axial spacing, one from the other, for generating a static homogeneous magnetic field in an examination volume, and a coil frame (6) carrying the coil sets, said examination volume being disposed between said coil sets, said coil frame and coil sets being configured, without structural support between the coil sets over an angle of at least 180° in a circumferential direction, related to the axis (4) of the magnet coil arrangement, for enabling room temperature access (50) to said examination volume in a direction transverse to the axis of the coil sets, for placement of the human limb or shoulder therein, said coil frame (6) having an axial central portion (8) extending not more than 180° in a circumferential direction, related to the axis (4) of the magnet coil arrangement, said magnet system further comprising cryostat means for cooling the coil sets, said cryostat means comprising a first coolant tank (15) for a first coolant having a low temperature, said coolant tank surrounding the coil frame and the coil sets on all sides, said coil sets being rigidly supported by the coil frame (6) and maintained at a cryogenic temperature by the cryostat means, said transverse room temperature access (50) to the examination volume extending at least over approximately 180° in circumferential direction, related to the axis (4) of the magnet coil arrangement, the coil sets having a radially inner and a radially outer winding with a current through the radially inner winding being directed opposite to a current through the radially outer winding.

2. Magnet system according to claim 1, wherein the area in which a homogeneous magnetic field prevails (area of homogeneity 12) is fully accessible through the access (50).

3. Magnet system according to claim 2, wherein the coil frame is formed in the central portion by rods extending in the axial direction.

4. Magnet system according to claim 1, wherein a cross-section of the coil frame (6') in the central portion has a crescent shape.

5. Magnet system according to claim 1, wherein a cross-section of the coil frame (6) in the central portion has a crescent shape and the coil frame is provided with a recessed portion for the area of homogeneity of the magnetic field.

6. Magnet system according to claim 1, further comprising coolant tank means (20) for holding an additional coolant having a higher temperature than said first coolant in order to act as a thermal screen for the first coolant tank, said coolant tank means being disposed in an area outside, in a radial direction from an axis of the first coolant tank (15), of a part of the coil frame interconnecting the coil sets, and outside of the first coolant tank.

7. Magnet system according to claim 6, further comprising another radiation screen (24) thermally connected with the second coolant and surrounding the coil sets at a small spacing.

8. Magnet system according to claim 1 further comprising a radiation screen (18) thermally connected with the first coolant and surrounding the coil sets at a small spacing.

9. Magnet system according to claim 1 further comprising ferromagnetic plates (30) disposed outside the cryostat means, in the proximity of outer sides of the coil sets, said ferromagnetic plates being rigidly connected to one another.

10. Magnet system according to claim 1, wherein the cryostat means surrounds, in an area between the coil sets, substantially only the coil frame, at the least possible spacing, while leaving free access to the examination volume.

11. Magnet system according to claim 1, wherein said cryostat means includes another coolant tank for another coolant of higher temperature than the first coolant, said another coolant tank being disposed only in a region of an outside of said coil frame located in the area between the coil sets.

12. Magnet system according to claim 1, further comprising at least one radiation screen disposed on the outer and inner sides of the said coil frame, in the area of the said coil sets, and on a periphery of the coil frame.

13. Magnet system according to claim 1, wherein parts of the coil frame supporting the windings are provided, in a radially central portion thereof, at least on sides thereof facing each other, with recesses (62) for the recessed accommodation of at least one set of coils disposed in a recessed area (64) of a wall (26) of the cryostat means, said one set being selected from a group consisting of gradient and shim coil sets (28).

14. Magnet system according to claim 1, wherein an axis of the magnet system extends in a horizontal direction.

15. Magnet system according to claim 1, wherein an axis of the magnet system extends in a vertical direction.

* * * * *